(12) United States Patent
Gray et al.

(10) Patent No.: US 10,983,167 B2
(45) Date of Patent: Apr. 20, 2021

(54) METHOD AND DEVICE FOR GAUGING AN ELECTRONIC APPARATUS

(71) Applicants: Richard Landry Gray, Saratoga, CA (US); weiguang qiu, Beijing (CN)

(72) Inventors: Richard Landry Gray, Saratoga, CA (US); weiguang qiu, Beijing (CN)

(73) Assignee: HUAYUAN SEMICONDUCTOR (SHENZHEN) LIMITED COMPANY, Shenzhen (CN)

( * ) Notice: Subject to any disclaimer, the term of this patent is extended or adjusted under 35 U.S.C. 154(b) by 138 days.

(21) Appl. No.: 16/441,000

(22) Filed: Jun. 14, 2019

(65) Prior Publication Data
US 2019/0383876 A1 Dec. 19, 2019

Related U.S. Application Data

(60) Provisional application No. 62/684,755, filed on Jun. 14, 2018.

(51) Int. Cl.
*G01R 31/367* (2019.01)
*G01R 31/392* (2019.01)
*G01R 31/382* (2019.01)
*G06N 3/08* (2006.01)

(52) U.S. Cl.
CPC ......... *G01R 31/367* (2019.01); *G01R 31/382* (2019.01); *G01R 31/392* (2019.01); *G06N 3/08* (2013.01)

(58) Field of Classification Search
CPC .. G01R 31/367; G01R 31/392; G01R 31/382; G01R 31/3842; G06N 3/08
See application file for complete search history.

(56) References Cited

U.S. PATENT DOCUMENTS

| | | | | |
|---|---|---|---|---|
| 5,825,156 A | * | 10/1998 | Patillon | G01R 31/367 702/63 |
| 9,255,973 B2 | * | 2/2016 | Song | G01R 31/367 |
| 2005/0137764 A1 | * | 6/2005 | Alvarez-Troncoso | G05B 13/026 701/36 |
| 2005/0194936 A1 | * | 9/2005 | Cho | H01M 10/48 320/132 |
| 2008/0024137 A1 | * | 1/2008 | Carlin | G01R 31/386 324/427 |

* cited by examiner

*Primary Examiner* — Manuel L Barbee

(57) ABSTRACT

Method and device for gauging an electronic apparatus are disclosed. The method comprising acts of processing measured data sets by a learned neural network to generate a gauging result, and updating neural coefficients of the learned neural network with a reference data for more accurate prediction. The learned neural network is trained with known algorithm or known data provided by the manufacture or collected from others. The device comprises sensors and controller. The sensors are configured to sense the electronic apparatus to generate the measured data sets. The controller has the learned neural network and a error feedback unit. The neural network generates the gauging result. The error feedback unit generates a reference data sensed from the electronic apparatus to the neural network for updating neural coefficients of the neural network for more accurate prediction.

6 Claims, 4 Drawing Sheets

METHOD AND DEVICE FOR GAUGING AN ELECTRONIC APPARATUS

CROSS-REFERENCE TO RELATED APPLICATIONS

This application claims priority from the U.S. provisional patent Ser. No. 62/684,755 filed on Jun. 14, 2018, the disclosure of which is incorporated herein by reference in its entirety.

FIELD OF THE INVENTION

The present invention relates to method and device for gauging an electronic apparatus.

BACKGROUND OF THE INVENTION

Gauging an electronic apparatus is to determine the performance and/or capabilities of the electronic apparatus, which is important and complex tasks in developing the electronic apparatus. For example, battery fuel consumption of an electronic automobile represents one performance of the car. Accurately predicting or measuring remaining charge of the battery fuel is critical.

Much work by many manufacturers has gone into developing algorithms that can extrapolate the remaining battery life based on battery variables and continually updating a database of those battery variables as they change over time.

However, determining the amount of charge left in a battery is an extremely vexing function for the engineer. This is especially true for particular battery types such as the popular Li-ion battery. The remaining charge will be dependent on the open circuit battery voltage, the battery temperature, the load current, age of the battery and behaviors for person using the battery.

SUMMARY

It is the objective of the present invention to provide a method and a device for gauging an electronic apparatus that addresses the aforementioned and other needs.

According to one aspect of the present invention, a method for gauging an electronic apparatus comprising acts of processing measured data sets by a learned neural network to generate a gauging result; and updating neural coefficients of the learned neural network with a reference data for more accurate prediction. The learned neural network is trained with a known algorithm or known data provided by the manufacture or collected from a third party.

In one embodiment, the method for gauging an electronic apparatus, comprising acts of obtaining an instantaneous measured data set and a plurality of measured data sets sequentially from the electronic apparatus, wherein the measured data sets is measured prior the instantaneous measured data set; processing the instantaneous measured data set and the measured data sets by a learned neural network to generate a gauging result, wherein the learned neural network has a learned algorithm; obtaining a reference data from the electronic apparatus; and updating neural coefficients of the algorithm from the neural network based on the reference data and the gauging result.

According to another aspect of the present invention. The device comprises sensors and controller. The sensors are configured to sense the electronic apparatus to generate the measured data sets. The controller has the learned neural network and a error feedback unit. The neural network generates the gauging result. The error feedback unit generates a reference data sensed from the electronic apparatus to the neural network for updating neural coefficients of the neural network for more accurate prediction.

In one embodiment, a device for gauging an electronic apparatus comprises a plurality of sensors, a memory unit, and controller and an error feedback unit. The sensors sense an external electronic apparatus sequentially for generating a plurality of measured data sets. The memory unit storing the measured date sets. The controller comprises an input component and a learned neural network. The learned neural network has a learned algorithm that processes the inputted measured data sets from the input component to generate a gauging result. The error feedback unit generates a reference data sensed from the electronic apparatus. The controller then compares the reference data with the gauging result to adjust neural coefficients of the neural network.

BRIEF DESCRIPTION OF THE DRAWINGS

The present invention is illustrated by way of example, and not by way of limitation, in the figures of the accompanying drawings in which like reference numerals refer to the same or similar elements and in which.

DETAILED DESCRIPTION

In the following description, embodiments are set forth as examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

Figure 1:
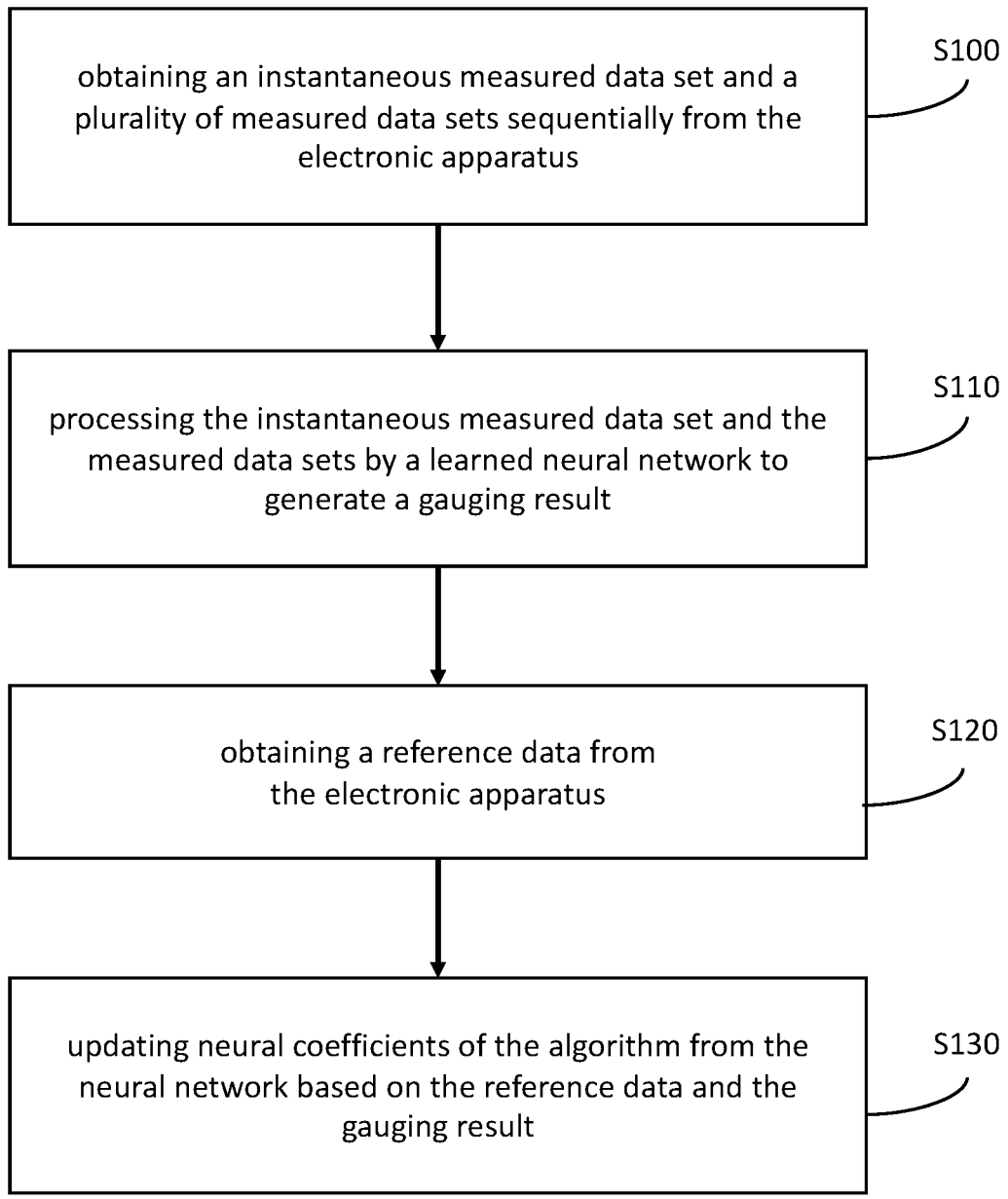
FIG. 1 is a flow chart illustrating a method for gauging an electronic apparatus in accordance with an embodiment of the present invention.

With reference to FIG. 1, FIG. 1 is a flow chart illustrating a method for gauging an electronic apparatus in accordance with an embodiment of the present invention. As shown in FIG. 1, the method for gauging an electronic apparatus comprises acts of S100 obtaining an instantaneous measured data set and a plurality of measured data sets sequentially from the electronic apparatus, wherein the measured data sets is measured prior to the instantaneous measured data set; S110 processing the instantaneous measured data set and the measured data sets by a learned neural network to generate a gauging result, wherein the learned neural network has a learned algorithm; S120 obtaining a reference data from the electronic apparatus; and S130 updating neural coefficients of the algorithm from the neural network based on the reference data and the gauging result.

The teaching for the learned neural network is using already discovered algorithms, or data already established. Almost any physical system that is poorly described by a closed form algorithm could have its operations improved by using this technique, without having to completely understand the underlying physics of the system on a mathematical basis.

Instead of striving to determine which algorithm is the best for representing the gauge of an electronic apparatus. The present invention proposes a neural network that the neural network that teaches itself the best algorithm and reconfigures itself so that its output (i.e., gauging results) is more accurately predicted with continued operation.

The benefit of such approach is at least not creating a mathematical model or algorithm. No actual battery is needed to teach the neural network. We could just use a matrix of data that was already collected. In other words, the neural network can be trained with known algorithms, and the known data sets which are obtained from others.

The method of the present invention allows a previously defined algorithm to be replicated by a neural network without having to know the underlying theory or definition of that algorithm. The previously defined algorithm can produce a dataset used for teaching the neural network how to replicate the function of the algorithm, while knowing nothing at all about the algorithm.

Figure 2:
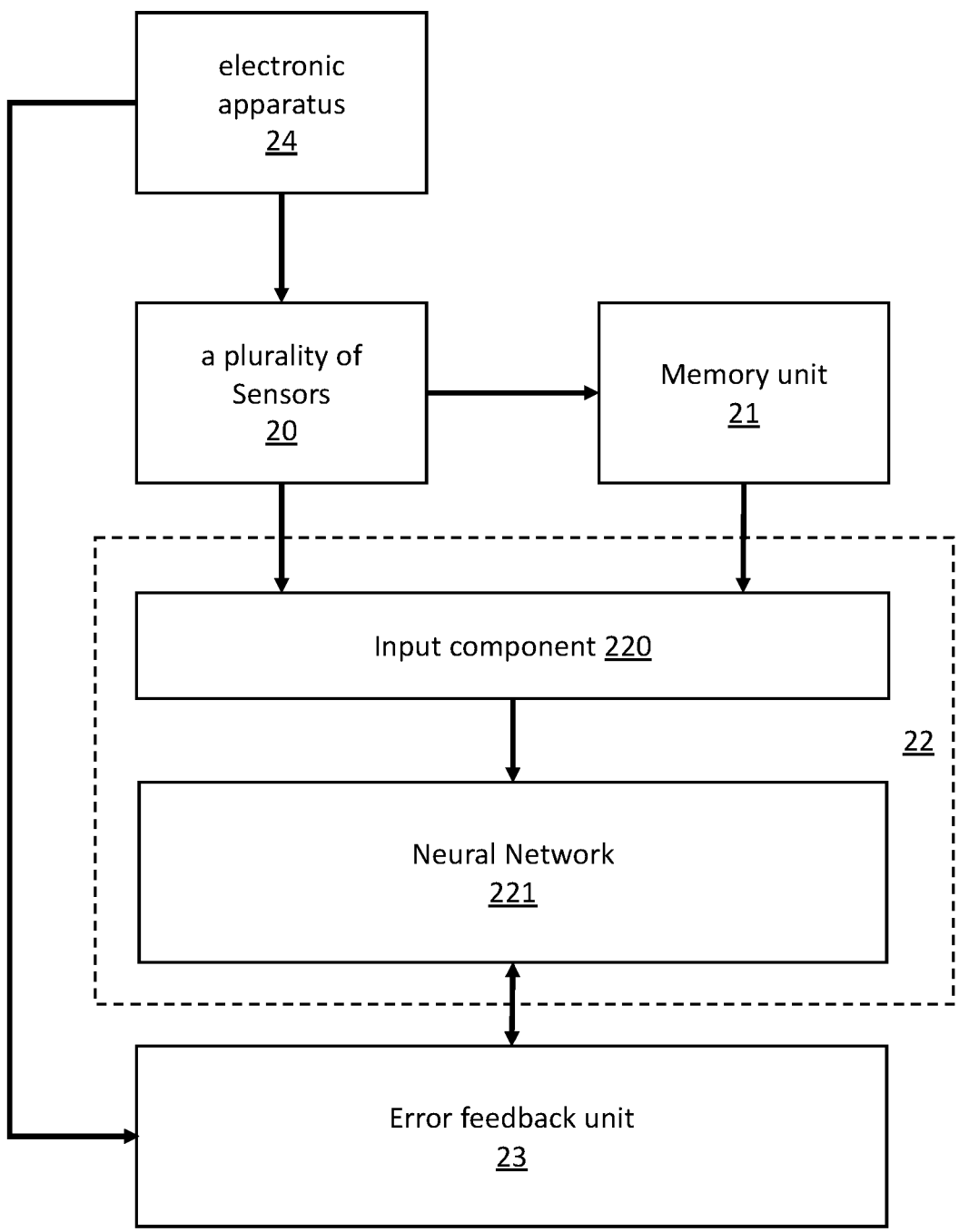
FIG. 2 is an exemplary diagram illustrating a device for gauging an electronic apparatus in accordance with an embodiment of the present invention.

With reference to FIG. 2, FIG. 2 is an exemplary diagram illustrating a device for gauging an electronic apparatus in accordance with an embodiment of the present invention. In this embodiment, the device adapted above-mentioned method comprises a plurality of sensors 20, a memory unit 21, a controller 22 and an error feedback unit 23. The sensors 20 senses an external electronic apparatus 24 sequentially for generating a plurality of measured data sets. The memory unit 21 stores the measured data sets. The controller 22 has an input component 220 and a learned neural network 221. The input component 220 receives an instantaneous measured data set directly from the plurality of sensors 20, and the measured data sets from the memory unit 21.

The learned neural network 221 has a learned algorithm that processes the inputted measured data sets from the input component 220 to generate a gauging result.

The error feedback unit 23 generates a reference data sensed from the electronic apparatus 24. The controller 22 compares the reference data with the gauging result to adjust neural coefficients of the neural network, and the reference data indicates a condition of the electronic apparatus 24.

In one embodiment, the electronic apparatus is a battery. The battery gauging device does not require much processing or measuring speed, and thus an inexpensive and quick way to implement the device would be with an off the shelf microcontroller unit (MCU) coupled with some custom analog measuring components (i.e., sensors). The analog measurement and the analog-digital converter (ADC) can be integrated together into a single IC, then interfaced to an industry standard MCU.

In the learning mode the battery variables are put into the neural network like coulomb count, temperature, battery voltage, battery current, full charge, min charge etc. The neural network calculates a value for remaining lifetime. That lifetime value is compared to the real lifetime of the battery as per real actual battery data or as per an already established accurate algorithmic model of battery life.

The results of the comparison indicate how the neural coefficients should be adjusted. This could take many thousands of iterations for the system to develop the most optimal neural coefficients and neural connections. But this is no problem for us because the calculations occur at the speed of modern digital electronics and will most likely be completed faster than is necessary. In a production environment, for a particular battery type, the neural coefficients and connections only need to be found once, then those coefficients can be loaded into every gas gauge product for that particular battery without the need for the learning mode.

In the operational mode, for a particular battery type, since the coefficients of the neural network are already found, the learned neural network 221 of the controller 22 is able to, based on the learned algorithm, to generate a gauging result for representing the remaining charge of the battery.

In one embodiment, the measured data sets inputted to the input component 220 at least comprises but is not limited to a battery current, a battery voltage, temperature, timestamp, a battery age, and charge current, which intuitively considered critical to estimating the gauging of the battery.

The measured data sets stored in the memory unit 21 is the operational history of the battery. As a person skilled in the art knows that operational history of the battery affects its remaining charge, so intuitively we record the history in the memory unit 21 as input to the learned neural network 221.

Figure 3:
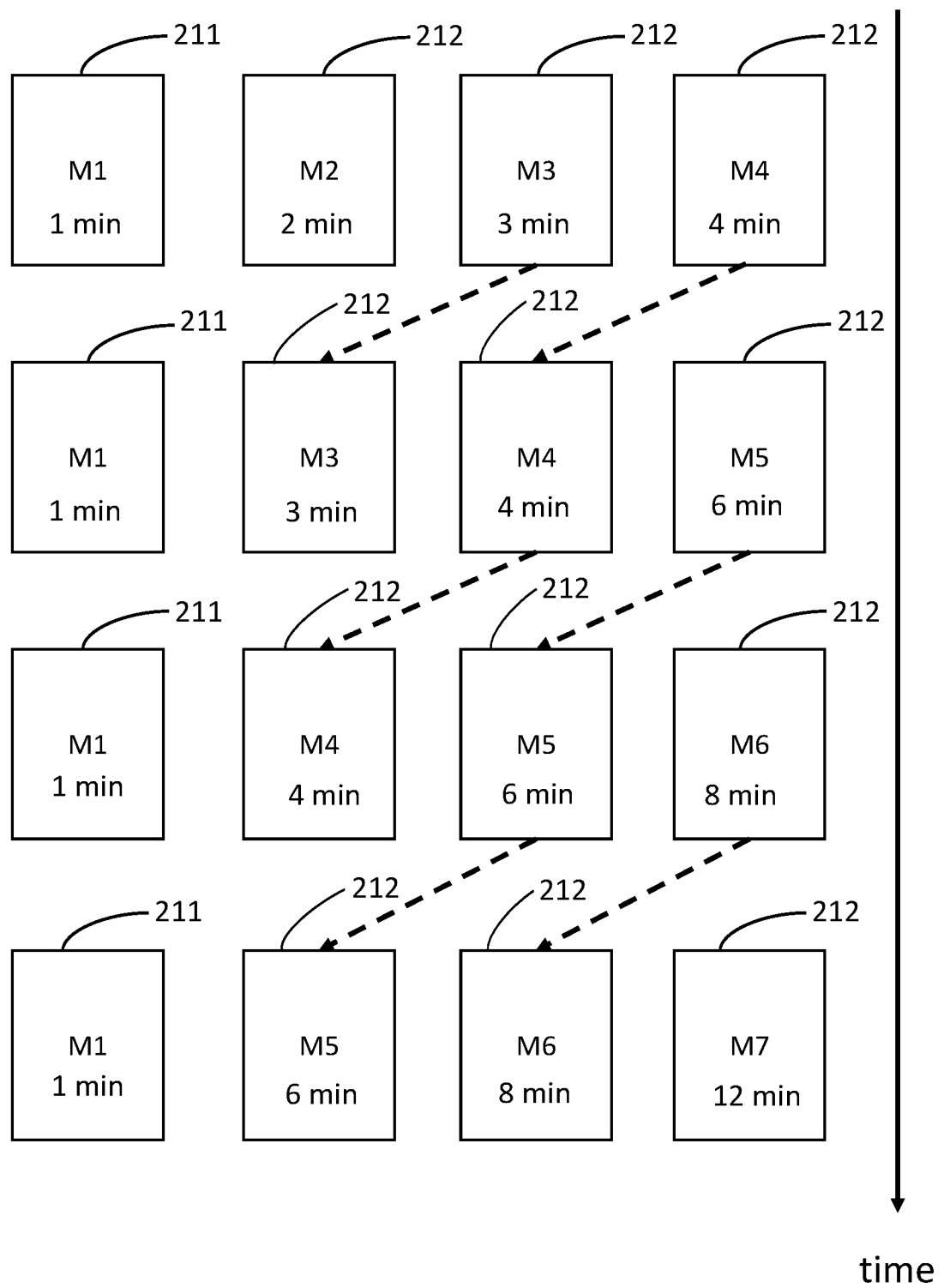
FIG. 3 is an exemplary diagram illustrating a rolling memory structure in accordance with an embodiment of the present invention.

With reference to FIG. 3, FIG. 3 is an exemplary diagram illustrating a rolling memory structure in accordance with an embodiment of the present invention. In order to conserve memory space, the present invention has proposed a polling memory structure for the memory unit 21. The rolling memory unit 21 is a memory structure that is configured for storing the measured data set, and comprises a fixed slot 211 and at least three replaceable slots 212. The fixed slot 211 stores the initial data set. The replaceable slots 212 sequentially stores the measured data sets and follows the First In and First Out (FIFO) rule. The initial data set is defined as a very first measured data set and is always stored in the fixed slot 211. The oldest memory slot 212 is erased and replaced with the data set from most recent time.

As shown in FIG. 3, the first row illustrated a first 4 times measurement. Each measured data set is recorded in 1 minute. Sum up with 4 minutes, the slots of the rolling memory unit are full M1, M2, M3, M4. As shown in the second row of FIG. 3, The fifth ($5^{th}$) measured data set M5 is inserted and the second ($2^{nd}$) measured data set M2 is erased. In the third row, the sixth ($6^{th}$) measured data set M6 is inserted and the third ($3^{rd}$) measured data set M3 is erased. In the fourth row, the seventh ($7^{th}$) measured data set M7 is inserted and the measured data set M4 is erased.

In an embodiment of FIG. 3, the recording time for the first row is 1 minute for each. The fifth measured data set M5 is recorded for 2 minutes. The sixth measured data set M6 is 2 minutes and the seventh ($7^{th}$) measure data set M7 is 4 minutes. Then as time goes on, the interval between each stored measured data sets increased.

It is noted that the number of the replaceable slots 212 can be up to its memory space limit. However, the proposed rolling memory unit 21 in accordance with an embodiment of the present invention that uses a fixed number of memory slots, which is able to conserve memory space and increase the distributed operating parameters converge as time goes on.

The controller 22 uses a learned neural network 221 to generate a gauging result based on the inputs of the measured data set, and comprises an input component 220. The input component 220 is connected to the sensors 22 and the rolling memory unit 21 which is configured for receiving an instantaneous measured data set directly from the plurality of sensors 20, and the historic data set (i.e., the initial data set and the measured data set) from the rolling memory unit 21.

Figure 4:
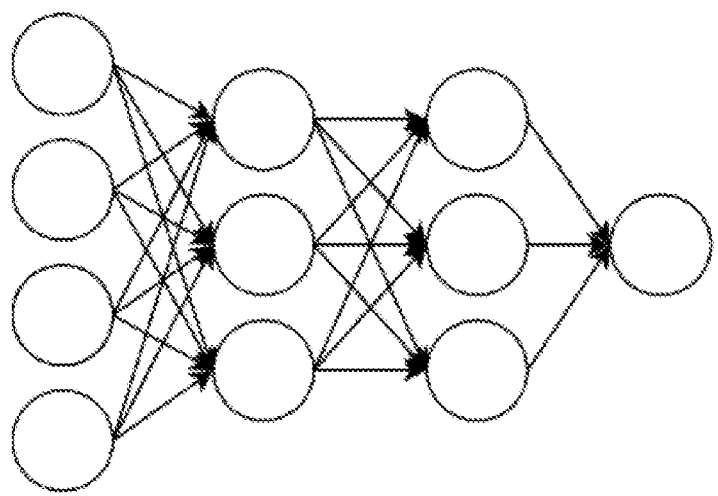
FIG. 4 is an exemplary diagram of a neural network in accordance with an embodiment of the present invention.

With reference to FIG. 4, FIG. 4 is an exemplary diagram of a neural network in accordance with an embodiment of the present invention. In this embodiment, the neural network 221 is a feed forward neural network (FFNN). The neural network 221 has two hidden layers nodal depth. Nodes in each layer has its corresponded algorithm functions, and each layer has its own weight and bias value. For a person skill in the art will realized that the depth of the neural network can be deeper, which means more hidden layers.

The error feedback unit 40, as shown in FIG. 2, is connected to the controller 23, and generates a reference data sensed from the electronic apparatus, the reference data indicates a condition of the battery. The controller 22 then compares the gauging result with the reference data to adjust neural coefficients of the neural network 221.

In one embodiment, the condition of the battery can be a full charge, minimum charge or no charge, which can be obtained by the sensor 20 sensing the charging status of the battery (e.g., from a battery charger). The reference data can increase the accuracy of gauging. For example, the full charge and the minimum charge could be used to adjust the temperature variable of the battery. The full charge or no charge can be considered as points to continue to teach itself as the battery ages.

In an embodiment, the error feedback unit further comprises a current sensing component that senses the current of the battery in pulsess which indicates the current change to the subsequent voltage change in the battery. The current sensing component may be a dummy load R across the terminals of the battery that produces a fixed increase in current for a very short amount of time. The subsequent change in battery voltage due to a known current change is a very useful indicator of the battery condition.

It is interesting to note that the sensed current does not have to be produced by a dummy load. Normal variation in battery current due to changes in load current will also produce voltage variations that can be tracked and used. The advantage of the dummy load is that it produces a known current at the time of the user's choosing. On the downside it does cause some wasted power, but the amount of wasted power could be made negligible by using very short pulses and using those pulses only occasionally.

It is also noted that as mentioned before, the present invention uses known algorithm or measured data already established to train the neural network. The learned neural network or the adapted algorithm may not be prefect, the reference data of the error feedback is able to provide additional realtime information which is able to make the learned neural network self updating to produce a more accurate prediction than the source (e.g., the known algorithm).

While the disclosure has been described in connection with a number of embodiments and implementations, the disclosure is not so limited but covers various obvious modifications and equivalent arrangements, which fall within the purview of the appended claims. Although features of the disclosure are expressed in certain combinations among the claims, it is contemplated that these features can be arranged in any combination and order.

The invention claimed is:

1. A device for gauging an electronic apparatus, comprising:
   a plurality of sensors sensing an external electronic apparatus sequentially for generating a plurality of measured data sets;
   a memory unit storing the measured data sets;
   a controller comprising
   an input component receiving an instantaneous measured data set directly from the plurality of sensors, and the measured data sets from the memory unit; and
   a learned neural network having a learned algorithm that processes the inputted measured data sets from the input component to generate a gauging result; and
   an error feedback unit generating a reference data sensed from the electronic apparatus, wherein the controller compares the reference data with the gauging result to adjust neural coefficients of the neural network, and the reference data indicates a condition of the electronic apparatus;
   wherein the memory unit is a rolling structure having a fixed slot and at least three replaceable slots, wherein the replaceable slots stores the sequentially measured data sets which follows the First In and First Out (FIFO) rule to be removed; and
   wherein the plurality of sensors sequentially senses the electronic apparatus in an interval, so that the period of the measured data sets stored in the replaceable slots is increased.

2. A device for gauging an external battery, comprising:
   a plurality of sensors sensing the battery sequentially for generating a plurality of measured data sets;
   a memory unit storing the measured data sets;
   a controller comprising
   an input component receiving an instantaneous measured data set directly from the plurality of sensors, and the measured data sets from the memory unit; and
   a learned neural network having a learned algorithm that processes the inputted measured data sets from the input component, which generates a gauging result;
   an error feedback unit generating a reference data sensed from the battery, wherein the controller compares the reference data with the gauging result to adjust neural coefficients of the neural network, and the reference data indicates a condition of the battery;
   wherein the memory unit is a rolling structure having a fixed slot and at least three replaceable slots, wherein the replaceable slots stores the sequentially measured data sets which follows the First In and First Out (FIFO) rule to be removed; and
   wherein the plurality of sensors sequentially senses the battery in an interval, so that the period of the measured data sets stored in the replaceable slots is increased.

3. The device as claimed in claim 2, wherein the measured data sets inputted to the input component at least comprises a battery current, a battery voltage, temperature, timestamp, a battery age, and charge current.

4. The device as claimed in claim 2, wherein the reference data indicates the battery being full charge, minimum charge or no charge.

5. The device as claimed in claim 2, wherein the error feedback unit has a current sensing component that senses the current of the battery in pulses which indicates the current change to the subsequent voltage change in the battery.

6. The device as claimed in claim 5, wherein the current sensing component is a dummy load across the terminals of the battery that produces a fixed increase in current.

* * * * *